United States Patent [19]

Ikubo et al.

[11] 4,371,403

[45] Feb. 1, 1983

[54] METHOD OF PROVIDING GETTERING SITES THROUGH ELECTRODE WINDOWS

[75] Inventors: Hiroyuki Ikubo; Kunihiko Wada, both of Yokohama, Japan

[73] Assignee: Fujitsu Limited, Kawasaki, Japan

[21] Appl. No.: 217,756

[22] Filed: Dec. 18, 1980

[30] Foreign Application Priority Data

Dec. 20, 1979 [JP] Japan .................. 54-166211

[51] Int. Cl.³ ................................ H01L 21/265
[52] U.S. Cl. .................... 148/1.5; 29/571; 148/187; 357/91; 427/82; 427/93
[58] Field of Search ............ 148/1.5, 187; 427/82, 427/93; 357/91; 29/571

[56] References Cited

U.S. PATENT DOCUMENTS

| | | | |
|---|---|---|---|
| 3,874,936 | 4/1975 | d'Hervilly et al. | 148/1.5 |
| 3,933,530 | 1/1976 | Mueller et al. | 148/1.5 |
| 4,061,506 | 12/1977 | McElroy | 148/1.5 |
| 4,069,068 | 1/1978 | Beyer et al. | 148/1.5 |
| 4,114,256 | 9/1978 | Thibault et al. | 29/571 |
| 4,133,701 | 1/1979 | Greenstein et al. | 148/1.5 |
| 4,271,582 | 6/1981 | Shirai et al. | 148/1.5 |

OTHER PUBLICATIONS

Beyer et al., IBM-TDB, 20, (1978), 3122.
Bogardus et al., IBM-TDB, 16, (1973), 1066.
Geipel et al., IBM-TDB, 21, (1978), 1373.

*Primary Examiner*—Upendra Roy
*Attorney, Agent, or Firm*—Staas & Halsey

[57] ABSTRACT

A method of fabricating semiconductor integrated circuit devices in which leakage currents at the junction and at the surface of one or more regions of desired conductivity type formed in a substrate are substantially reduced. Shallow source and drain regions are formed by ion implantation of arsenic, an insulating layer of phosphosilicate glass (PSG) is formed on the entire surface of the semiconductor substrate, openings are cut through the PSG layer to form windows of smaller area than the surface area of the regions for contacts, electrodes, to the regions, oxygen ions having the effect of gettering defects are ion implanted through these windows into the surface of source and drain regions but controlled so as not to reach the pn junctions, and the PSG layer is thermally melted to produce a MOS memory device, other MOS devices, or bipolar transistors.

5 Claims, 9 Drawing Figures

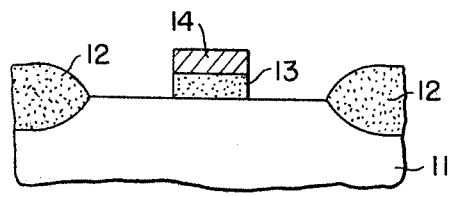
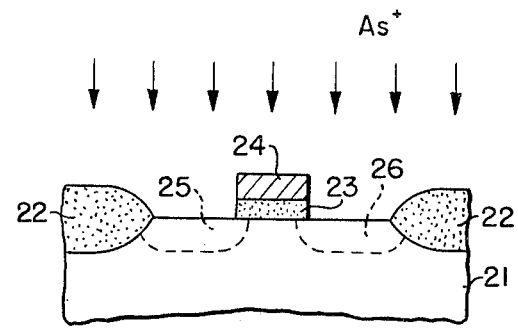
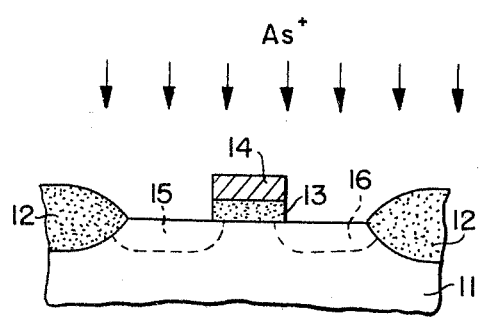
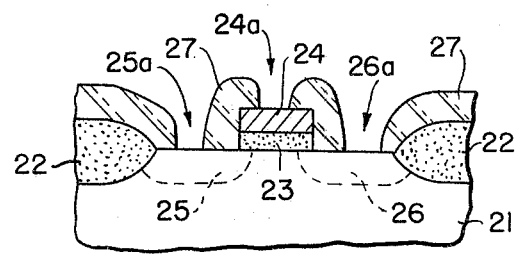
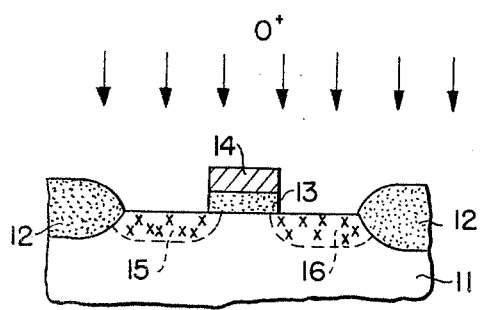
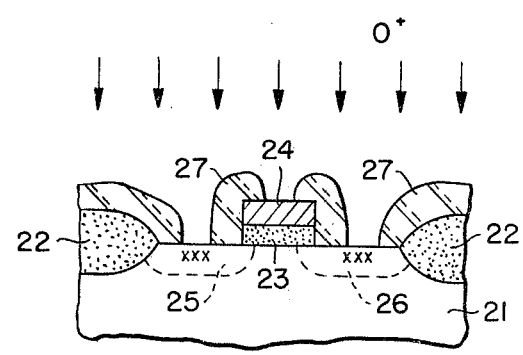
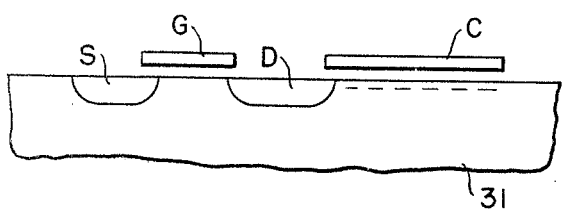
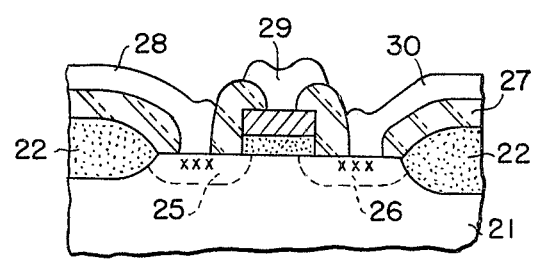

METHOD OF PROVIDING GETTERING SITES THROUGH ELECTRODE WINDOWS

BACKGROUND OF THE INVENTION

This invention relates to a method of manufacture of a semiconductor device, and more particularly to a novel method of ion implanting atoms capable of gettering defects into the surface of one conductivity type region for the purpose of improving semiconductor integrated circuit yields and reliability by minimizing leakage current at the junction and the surface.

Referring to metal-oxide-semiconductor integrated circuits (MOS IC) devices, there is a trend in the industry to form source and drain regions shallow for the purpose of increasing packing density, for example 64 K bits in the case of a MOS memory. To keep pace therewith, the impurity material used is now being changed from phosphorus (P) to arsenic (As), and ion implantation is replacing thermal diffusion for introducing the impurity material into the semiconductor substrate. Arsenic has a larger nuclear radius than phosphorus, the nuclear radius being proportional to the mass number and the mass number of arsenic being larger than that of phosphorus. It may be the consequence of this that the damage to the semiconductor substrate is considerable when arsenic is ion implanted instead of phosphorus. Defects are caused to be generated thereby, and characteristics of semiconductor devices are deteriorated; for example, a large leakage current is observed when a reverse bias is applied.

These defects may be decreased by subsequent heat treatment of the semiconductor substrate, but some defects still remain and exert an adverse infuence on the characteristics of the semiconductor device. As is well known to the person skilled in the art, dynamic memory uses capacitors, usually the capacitors of MOS field effect transistors, to store bits of data at the rate of one bit per capacitor (FIG. 3). With such MOS memories, the capacitors must be recharged periodically to prevent data loss due to leakage. It is better if the interval (refresh time) of this recharging, which is called refreshing, is longer. Thus, the less the leakage, the longer the refresh time. Likewise, a dynamic memory uses a number of MOS circuits in series, with the capacitor as the storage element, one capacitor being needed per bit.

For the purpose of minimizing leakage current between two predetermined mixed conductivity type regions of the semiconductor device, a method of ion implanting arsenic through an oxide layer (e.g., a layer of silicon dioxide) formed on the surface of a semiconductor substrate has been proposed, instead of ion implanting arsenic directly, which proposed method is effective in minimizing the leakage current. This is understood to be due to the knock on effect of oxygen, that is, the oxygen atom in the layer of silicon dioxide is dislodged from a silicon atom by ion implantation of arsenic and is driven into the semiconductor substrate. The inventors then conceived of ion implanting oxygen directly into the semiconductor substrate, and carried on a number of experiments and achieved satisfactory results as will be described hereinafter.

A gettering method recently developed is illustrated in FIGS. 1A to 1C which are cross-sectional views of the steps to carry out such method. In this method, a field oxide layer 12 is formed on a p-type silicon semiconductor substrate 11 by selective oxidizing technique, a gate insulating layer 13 of silicon dioxide and a gate electrode 14 of polycrystalline silicon are formed in the active region as shown in FIG. 1A in accordance with a conventional technique for fabricating MOS devices. Arsenic ions As+ are ion implanted as illustrated in FIG. 1B to form shallow N+ type source and N+ type drain regions 15, 16, each less than 1 μm deep. According to the method, oxygen ions O+ are ion implanted as depicted in FIG. 1C, and oxygen ions thus driven into the semiconductor substrate are illustrated by x marks. It is understood that oxygen driven into the semiconductor substrate has a pinning effect, that is, oxygen takes in or absorbs such lattice defects as recombination centers and functions to getter defects, thereby prolonging carrier lifetime. Experiments confirmed that with the shallow junction into which oxygen has been driven, leakage current is low when reverse bias is applied, which shows that characteristics of the junction are improved. However, the method does not solve the problem of surface leakage.

Where oxygen ions are ion implanted as shown in FIG. 1C, they are driven into parts where source and drain regions are in contact with oxide layers 12 and 13, which is believed to be the cause of surface leakage current.

A specific prior art pertinent to the present invention is U.S. Pat. No. 4,069,068 granted to Beyer et al. In the invention disclosed therein, an emitter area is formed in a silicon nitride layer on a silicon dioxide layer. Through this window, ions of argon for gettering defects are implanted in the surface of the base region as shown in FIG. 2. Next, using the same window, the silicon dioxide layer in the emitter area window is removed, and then, as shown in FIG. 3, the n+ type emitter region is formed by thermally diffusing the n+ type impurities through the window. Finally, a metallized emitter contact is formed.

It is clear from the foregoing that the very same window is used for implantation of gettering materials and diffusion of impurities. The inventors of the present invention reasoned that nucleation sites may remain near the emitter-base junction of FIG. 3, tending to increase leakage current at or near the surface of the n+ type emitter region defined by the window.

SUMMARY OF THE INVENTION

It is therefore the primary object of the present invention to offer a method of manufacturing a semiconductor device of which the characteristics with regard to surface leakage current are improved.

In one embodiment of the invention to achieve said object, arsenic ions are implanted into a semiconductor substrate to form source and drain regions, and then an insulating layer is formed on the entire surface of the semiconductor substrate. The insulating layer is next etched to open windows for contacts or electrodes to source and drain regions and thereafter gettering material capable of gettering defects such as oxygen is ion implanted through these windows into the surfaces of source and drain regions.

In the embodiment of the invention, the insulating layer is formed by phosphosilicate glass (PSG), and said PSG layer is thermally melted after the implantation of oxygen is performed.

In another embodiment of the invention a carbon (C+), fluorine (F+), or argon (Ar+) is ion implanted instead of oxygen.

The above and further objects and novel features of the invention will appear more fully from the following detailed description when read in connection with the accompanying drawings. It is to be expressly understood, however, that the drawings are not intended as a definition of the invention but are for the purpose of illustration only.

BRIEF DESCRIPTION OF THE DRAWINGS

In the drawings wherein like parts are marked alike:

FIGS. 1A to 1C are cross-sectional views of a MOS semiconductor device in successive stages in accordance with a method practiced experimentally by the present inventors for manufacturing a MOS semiconductor device, and which method is different from the method of the present invention, FIGS. 2A, 2B, 2C and 2D are cross-sectional views of a MOS semiconductor device in successive stages and illustrating the steps to carry out the method of the present invention, FIG. 3 is a cross-sectional view of a one transistor—one capacitor MOS dynamic memory cell.

DESCRIPTION OF THE PREFERRED EMBODIMENT

Figure 4:
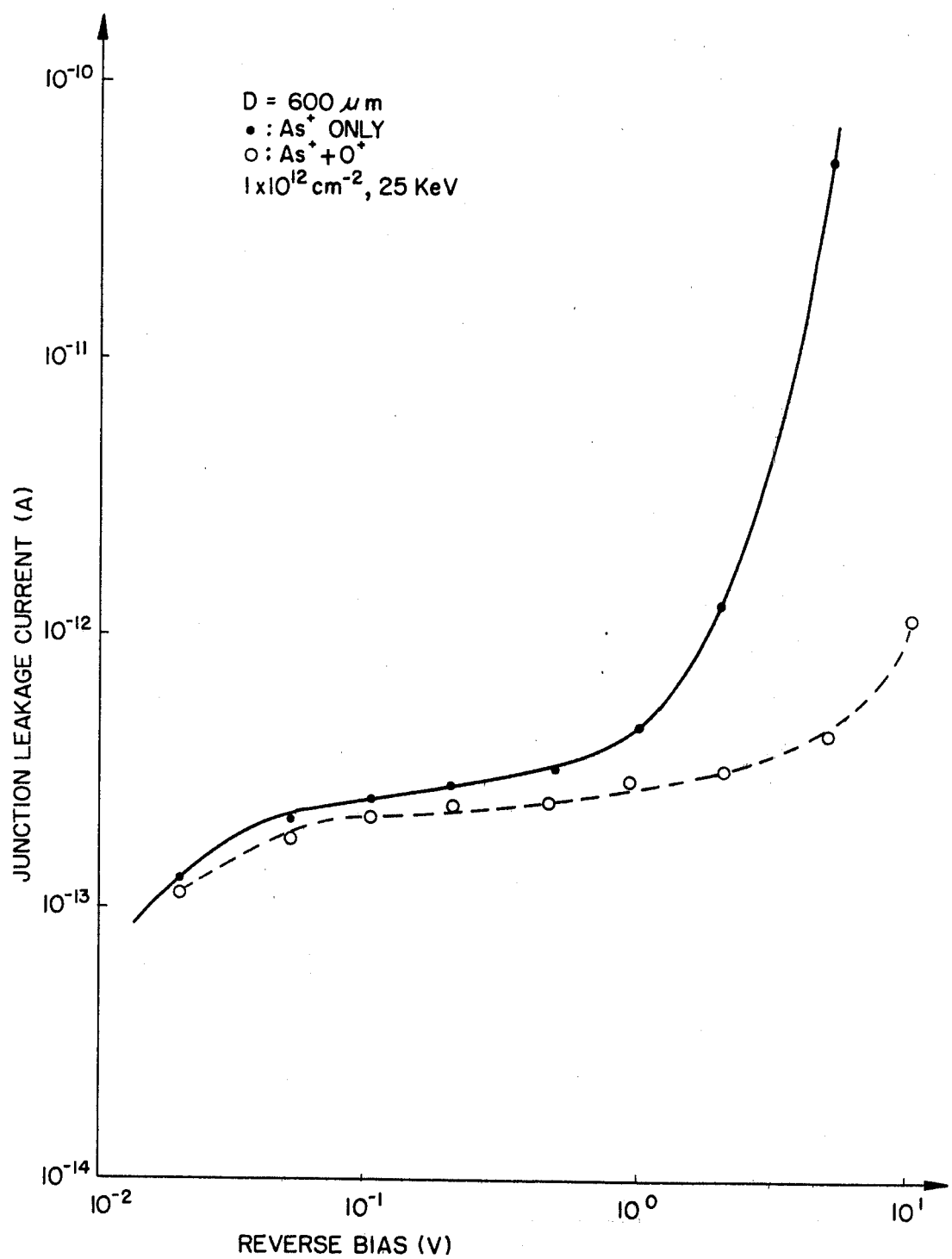
FIG. 4 is a graphic illustration of the relationship between the junction leakage current and the reverse bias in a wafer prepared in accordance with the method of the invention.

Steps to carry out the method of the invention are illustrated in FIGS. 2A, 2B, 2C and 2D which are cross-sectional views a MOS field effect transistor in successive stages of fabrication in accordance with the practice of the method of this invention. As was done in accordance with the step shown in FIG. 1A, a field oxide layer 22 is formed on a p-type silicon semiconductor substrate 21, and a gate oxide layer 23 and a gate electrode 24 are formed on the active region using conventional techniques. Thereafter, arsenic ions As+ are ion implanted with an energy of 50 KeV at a dosage of $4 \times 10^{15}$ cm$^{-2}$ to form N+ type source and N+ type drain regions 25 and 26. Such a technique is conventional. The state of the semiconductor substrate shown in FIG. 2A is similar to that depicted in FIG. 1B.

In accordance with the method of the invention, a PSG layer 27 is formed on the entire surface of the semiconductor substrate using a conventional technique, such as a sputtering or a chemical vapor deposition (CVD) technique. Windows 25A, 26a and 24a for electrodes or contacts for source and drain regions and the gate electrode are cut through the PSG layer 27 by conventional etching as illustrated in FIG. 2B. The areas of the windows 25a, 26a are smaller than the areas actual surface of the source region 25 and the drain region 26 respectively. As will be understood by the person skilled in the art, the processes described so for do not involve any difficult steps.

In this embodiment, the field oxide layer 22 is 8,000 Å thick, the gate oxide layer 23 400 Å thick, the gate electrode 24 3,000 Å thick, the width of the gate electrode 24 is 3 μm, and the PSG layer 27 is 1 μm thick, approximately.

Next, as shown in FIG. 2C oxygen ions O+ are ion implanted into the surfaces of the source region 25 and the drain region 26 through the windows 25a and 26a respectively according to a known technique and with an energy level of 25 KeV at a dosage of $1 \times 10^{12}$ cm$^{-2}$. In FIG. 2C, the marks x show oxygen thus driven into the semiconductor substrate. Instead of oxygen, carbon (C+), fluorine (F+) or argon (Ar+) may also be used. In this case, the resistance of the gate electrode 24 is not increased.

Next, that is, after the oxygen ion implantation is over, the PSG layer 22 as shown in FIG. 2C is melted by heat treatment at 1050° C.~1100° C. The arsenic ions and the oxygen ions are activated by this heat treatment.

Thereafter, a conductive layer such as a polycrystalline silicon layer of 500 Å thickness and an aluminum (Al) layer of 1 μm thickness is formed on the entire surface. A source electrode 28, a drain electrode 29 and a gate lead-out electrode 30 then are formed by etching of the conductive layer using conventional techniques as illustrated in FIG. 2D.

Oxygen driven into the semiconductor substrate perform a gettering function such as absorbing or taking in of lattice defects, such as recombination centers for example. However, in the method of the invention, oxygen is not ion implanted through the windows employed for diffusion to form source and drain regions as shown in FIG. 1C, but through windows which are provided for forming contacts, or electrodes, for the to source and drain regions. Because of this, and since the ion implantation of oxygen has been made shallow, oxygen is localized as shown in FIG. 2C to only those surfaces areas where the source and drain contacts or electrodes are in contact with the source and drain regions.

Thus, lattice defects such as recombination centers are not present in the periphery of the source and drain regions, but are localized and restricted to the vicinity of the actual contact areas. Due to this, currents leaking and flowing through the junctions of the source and drain regions 25, 26 and the semiconductor substrate 21 and the surfaces of the source and drain regions may be minimized, rendering it possible to substantially decrease leakage current at the time a reverse bias is applied.

It is believed that, with respect to the leakage current $I_L$—gate voltage $V_G$ characteristic of junction leakage current in a gate controlled diode, an increase of $I_L$ in areas where $V_G$ is negative is due to lattice defects, and experiments confirmed that the increase of $I_L$ may be suppressed by the method of the invention, as described above.

FIG. 4 shows the relationship between junction leakage current and reverse bias of a wafer having a diameter of 600 μm prepared in accordance with the method of the invention. Thus, the values given are not the values per unit area. Arsenic ions are ion implanted with an energy of 50 KeV at a dosage of $4 \times 10^{15}$ cm$^{-2}$, and oxygen ions are implanted with an energy of 25 KeV at a dosage of $1 \times 10^{12}$ cm$^{-2}$. The solid line shows the case where arsenic ions are ion implanted as shown in FIG. 1B; the dotted line shows the case where oxygen ion implantation is carried out after arsenic ion implantation according to the method of the invention as illustrated in FIG. 2C.

A typical dynamic memory cell, or one transistor—one capacitor memory cell, is shown in FIG. 3 in cross-section for the purpose of illustrating where the method of the invention may be applied effectively. As is well known to the person skilled in the art, source region S and drain region D are formed in the semiconductor 31, an oxide layer next is formed on the semiconductor substrate, and then a gate electrode G and a capacitor electrode C are fabricated. If there is a large leakage current in the drain region D, charges stored in the depletion layer in the semiconductor substrate below the capacitor electrode C, these charges being the stored data, are lost through the drain region D. The capacitor must be periodically recharged to prevent such data loss. It will thus be understood that the method of the invention is useful when applied to the device shown in FIG. 3.

As described before, leakage currents at the junction and the surface may be minimized in a device manufactured according to the method of the invention which utilizes techniques conventional to the art. Although the invention has been illustrated and disclosed with reference to a MOS memory, it will be understood by those skilled in the art that the method of the invention may be applied, without departing from the principle and scope of the invention, to MOS devices other than memory devices as well as to bipolar transistors and, bipolar integrated circuit devices.

In the embodiment of the invention described so far, ions of arsenic are ion implanted into a p-type semiconductor substrate to form $n^+$-type regions. It will be understood by those skilled in the art that other impurity material such as phosphorus (P) may also be used for the same purpose just as effectively as arsenic. It will also be clear to those skilled in the art that the principle of the invention can also be applied where an n-type semiconductor substrate is used in which case ions of an impurity material such as boron (B) are ion implanted into the n-type semiconductor substrate.

We claim:

1. A method of manufacturing a semiconductor device employing a semiconductor substrate having a main surface comprising the steps of:

ion implanting an impurity material into a predetermined surface area of the main surface of said semiconductor substrate to form at least one desired region of a predetermined conductivity type extending into said substrate from said main surface thereof and forming a pn junction with said substrate material, forming an insulating layer on the entire said selected main surface of said semiconductor substrate, opening a window in said insulating layer aligned with each respective said at least one desired region and having a smaller area than said predetermined surface area of said respective desired region for an electrical contact to said desired region within said smaller area, implanting ions of a gettering material having the effect of gettering defects through said window and into the surface of said desired region, localized therein by said smaller area of said window and to a controlled depth so as not to reach said pn junction of said region with said substrate, said gettering material being selected from the class consisting of oxygen, carbon, fluorine and argon, and providing a conductive layer on said substrate main surface including said insulating layer thereon, and forming an electrode for electrically contacting each said desired region within said respective window.

2. The method of claim 1 wherein said impurity material is selected from the class consisting of arsenic, phosphorus and boron.

3. The method of claim 1 wherein two said desired regions are formed, respectively comprising source and drain regions of a MOS field effect transistor.

4. The method of claim 1 wherein said gettering material is selected from the class consisting of oxygen, carbon, fluorine and argon.

5. The method of claim 1 wherein said insulating layer comprises phosphosilicate glass, and said method further comprises the steps of thermally melting said insulating layer after the step of ion implantation of said gettering material.

* * * * *

UNITED STATES PATENT AND TRADEMARK OFFICE
CERTIFICATE OF CORRECTION

PATENT NO. : 4,371,403          Page 1 of 2

DATED : February 1, 1983

INVENTOR(S) : Hiroyuki Ikubo et al.

It is certified that error appears in the above-identified patent and that said Letters Patent is hereby corrected as shown below:

Front page, [57] ABSTRACT, line 11, after "contacts" insert --or--;

Col. 1, line 34, after "remain" insert --,--;

Col. 2, line 58, after "regions" insert --,--;

line 61, before "source" insert --the--;

line 64, after "the" insert --ion--;

line 66, "a" should be --,--;

Col. 3, line 55, after "26" insert --,--;

line 56, "for" should be --far--;

line 65, after "26a" insert --,--;

line 66, after "respectively" insert --,--;

Col. 4, line 18, "form" should be --forms--;

UNITED STATES PATENT AND TRADEMARK OFFICE
CERTIFICATE OF CORRECTION

PATENT NO. : 4,371,403　　　　　　Page 2 of 2

DATED : February 1, 1983

INVENTOR(S) : Hiroyuki Ikubo et al.

It is certified that error appears in the above-identified patent and that said Letters Patent is hereby corrected as shown below:

line 18, after "function" insert --,--;

line 24, delete "to";

Col. 5, line 4, "these" should be --those--;

line 19, after "and" delete ",".

Signed and Sealed this

Twelfth Day of July 1983

[SEAL]

*Attest:*

GERALD J. MOSSINGHOFF

*Attesting Officer*　　　*Commissioner of Patents and Trademarks*